(12) United States Patent
Knox et al.

(10) Patent No.: US 11,777,314 B2
(45) Date of Patent: Oct. 3, 2023

(54) BEHIND-THE-METER SYSTEM AND METHOD FOR CONTROLLED DISTRIBUTION OF SOLAR ENERGY IN MULTI-UNIT BUILDINGS

(71) Applicant: Allume Energy Pty Ltd, Richmond (AU)

(72) Inventors: Cameron Knox, Richmond (AU); Tian Ting, Richmond (AU)

(73) Assignee: Allume Energy Pty Ltd

( * ) Notice: Subject to any disclaimer, the term of this patent is extended or adjusted under 35 U.S.C. 154(b) by 193 days.

(21) Appl. No.: 16/500,957

(22) PCT Filed: Apr. 9, 2018

(86) PCT No.: PCT/AU2018/050323
§ 371 (c)(1),
(2) Date: Oct. 4, 2019

(87) PCT Pub. No.: WO2018/184076
PCT Pub. Date: Oct. 11, 2018

(65) Prior Publication Data
US 2020/0036190 A1    Jan. 30, 2020

(30) Foreign Application Priority Data

Apr. 7, 2017   (AU) ................................ 2017901294
Dec. 15, 2017  (AU) ................................ 2017905018

(51) Int. Cl.
*H02J 3/32*     (2006.01)
*G01R 21/133*   (2006.01)
*H02J 3/38*     (2006.01)

(52) U.S. Cl.
CPC .............. *H02J 3/32* (2013.01); *G01R 21/133* (2013.01); *H02J 3/381* (2013.01); *H02J 2300/24* (2020.01)

(58) Field of Classification Search
CPC ........ H02J 3/383; H02J 2300/24; H02J 3/388; H02J 3/40; H02J 3/42; H02J 3/44;
(Continued)

(56) References Cited

U.S. PATENT DOCUMENTS 5,473,528 A      12/1995  Hirata et al.
8,242,634 B2 *   8/2012   Schatz ...................... H02J 3/38
                                                           307/82
(Continued)

FOREIGN PATENT DOCUMENTS

EP       1263108 A1     12/2002
JP       S59-198879 A   11/1984
(Continued)

*Primary Examiner* — Thomas C Lee
*Assistant Examiner* — Michael Tang
(74) *Attorney, Agent, or Firm* — KELLY & KELLEY, LLP (57) ABSTRACT

A behind-the-meter system for controlled distribution of solar power to units in a multi-unit building connected to an electric power grid. The system includes a grid-tied inverter connectable between a solar power generator and the electric power grid sensors for measuring instantaneously power demand and solar power consumption of the units and solar power generation and switches for connecting and disconnecting the units from the solar power generator. A controller, connected to the sensors and the switches determines relative values of power demand and solar power consumption of the units based on the instantaneous measurements of the power demand and the solar power consumption, and controls the switches to distribute solar power from the solar power generator.

12 Claims, 8 Drawing Sheets

(58) Field of Classification Search
CPC .... H02J 3/46; H02J 3/466; H02J 3/472; H02J 3/48; H02J 3/50; H02J 13/0006; H02J 3/06; H02J 3/386; H02J 3/387; H02J 3/385; H02J 3/382; H02J 3/32; H02J 3/381; G01R 21/00; G01R 21/133; G01R 21/1336; G01R 21/1338; Y02B 10/10; Y02E 10/56; Y02E 70/30
USPC .................................. 700/286; 307/115, 31
See application file for complete search history.

(56) References Cited

U.S. PATENT DOCUMENTS

| | | |
|---|---|---|
| 2002/0024828 A1 | 2/2002 | Hayashi et al. |
| 2002/0082747 A1* | 6/2002 | Kramer .................. H02J 3/004 700/276 |
| 2002/0143438 A1* | 10/2002 | Akiyama ................ H02J 3/381 700/286 |
| 2009/0027932 A1* | 1/2009 | Haines .................... H02J 9/062 363/95 |
| 2013/0035802 A1* | 2/2013 | Khaitan ................. G05B 15/02 700/297 |
| 2014/0327316 A1 | 11/2014 | Takahashi et al. |
| 2014/0379156 A1 | 12/2014 | Kamel et al. |
| 2016/0013646 A1* | 1/2016 | Akerson ............. H02J 13/0006 307/39 |
| 2019/0237995 A1* | 8/2019 | Akita ........................ H02J 3/44 |

FOREIGN PATENT DOCUMENTS

| | | | |
|---|---|---|---|
| JP | 2014/82915 A | 5/2014 | |
| KR | 20100130099 A | * 12/2010 | |
| WO | 2013/128588 A1 | 6/2013 | |
| WO | WO-2013128422 A1 | * 9/2013 | ............. G05B 15/02 |

* cited by examiner

BEHIND-THE-METER SYSTEM AND METHOD FOR CONTROLLED DISTRIBUTION OF SOLAR ENERGY IN MULTI-UNIT BUILDINGS

FIELD

The present invention relates to a behind-the-meter system and method for controlled distribution of solar energy in multi-unit buildings, for example, residential apartment buildings.

BACKGROUND

As population density increases, apartment blocks are becoming increasingly prevalent. Currently in Australia, about 32% of new builds are apartments, of which about 73% are three stories or fewer, making these buildings highly eligible for solar power. However, there currently exists no delivery model that allows this section of the population to access solar power in an affordable way, whilst ensuring the solution is within the constraints of Australian energy regulations.

There are two main conventional methods for grid-connected solar systems. The first is an embedded network, which involves the installation of a 'parent meter' that acts as a gateway in front of all the existing meters to monitor the total power flow into the apartment block. The existing meters of all participating tenants must be replaced and converted to 'orphan meters'. The solar power supply can then be wired behind the parent meter and monitored by the orphan meters as they would retail electricity. The disadvantages of this approach in existing apartments are the high cost of replacing the meters and the large regulatory costs of dealing with the distributive network. Typically, at least 80% of the tenants in the building must join the network and they have no flexibility to opt out in the future. Additionally, for an embedded network to be installed in a new apartment build, there is a minimum threshold of energy throughput required to make the installation viable for the embedded network provider. The threshold currently corresponds to approximately 60 units but this number is growing as apartments are becoming more energy efficient.

The second conventional method involves wiring a separate small solar system to each tenant. The disadvantages of this approach are the complexity and associated costs of separate installations, and the inefficient usage of solar energy. That is, high daytime users may not have a large enough solar system to cover their consumption while neighbouring low daytime consumers may be inefficiently exporting their excess solar energy to the grid.

In this context, there is a need for improved behind-the-meter systems for distributing and controlling solar power in multi-unit buildings.

SUMMARY

According to the present invention, there is provided a behind-the-meter system for controlled distribution of solar power to units in a multi-unit building connected to an electric power grid, the system comprising:
a grid-tied inverter connectable between a solar power generator and the electric power grid;
sensors configured to measure instantaneously:
power demand and solar power consumption of the units; and
solar power generation by the solar power generator;
switches configured to selectively connect and disconnect the units from the solar power generator; and
at least one controller connected to the sensors and the switches, wherein the at least one controller is configured to:
determine relative values of power demand and solar power consumption of the units based on the instantaneous measurements of the power demand and the solar power consumption of the units; and
selectively and individually control the switches to distribute solar power from the solar power generator between the units based on the relative values of the power demand and the solar power consumption of the units to maximise solar power consumption by the units.

The at least one controller may be further configured to:
pre-emptively identify cross flow of solar power between the units based on:
the relative values of the power demand and the solar power consumption of the units; and
the instantaneous measurements of the solar power generation by the solar power generator; and
selectively and individually control the switches to isolate the units from the solar power generator based on the pre-emptive cross flow identification to prevent the cross flow of solar power between the units.

The solar power generator may comprise a solar photovoltaic array.

The switches may comprise solid-state relays (SSRs).

The sensors may comprise power measurement integrated circuits (ICs) connected to power supply lines of the units by current transformer (CT) clamps.

The at least one controller, SSRs and power management ICs may be provided on one or more printed circuit boards (PCBs).

The at least one controller may comprise a main microcontroller and sub-microcontrollers, wherein the main microcontroller is connected to power management ICs and SSRs in a main distribution control module, and the sub-microcontrollers are connected to power management ICs in detached metering modules located in a main switchboard of the multi-unit building.

The detached metering modules may be wired and/or wirelessly connected to the main distribution control module.

The present invention also provides a behind-the-meter method for controlled distribution of solar power to units in a multi-unit building connected to an electric power grid, the method comprising:
connecting a grid-tied inverter between a solar power generator and the electric power grid;
providing sensors configured to measure instantaneously:
power demand and solar power consumption of the units; and
solar power generation by the solar power generator;
providing switches configured to selectively connect and disconnect the units from the solar power generator;
determining relative values of power demand and solar power consumption of the units based on the instantaneous measurements of the power demand and the solar power consumption of the units; and
selectively and individually controlling the switches to distribute solar power from the solar power generator between the units based on the relative values of the power demand and the solar power consumption of the units to maximise solar power consumption by the units.

The method may further comprise:
pre-emptively identifying cross flow of solar power between the units based on:
the relative values of the power demand and the solar power consumption of the units; and
the instantaneous measurements of the solar power generation by the solar power generator;
selectively and individually controlling the switches to isolate the units from the solar power generator based on the pre-emptive identification to prevent the cross flow of solar power between the units.

The present invention also provides a multi-unit building comprising the system described above or using the method described above.

BRIEF DESCRIPTION OF DRAWINGS

Embodiments of the invention will now be described by way of example only with reference to the accompanying drawings, in which.

DESCRIPTION OF EMBODIMENTS

Figure 1:
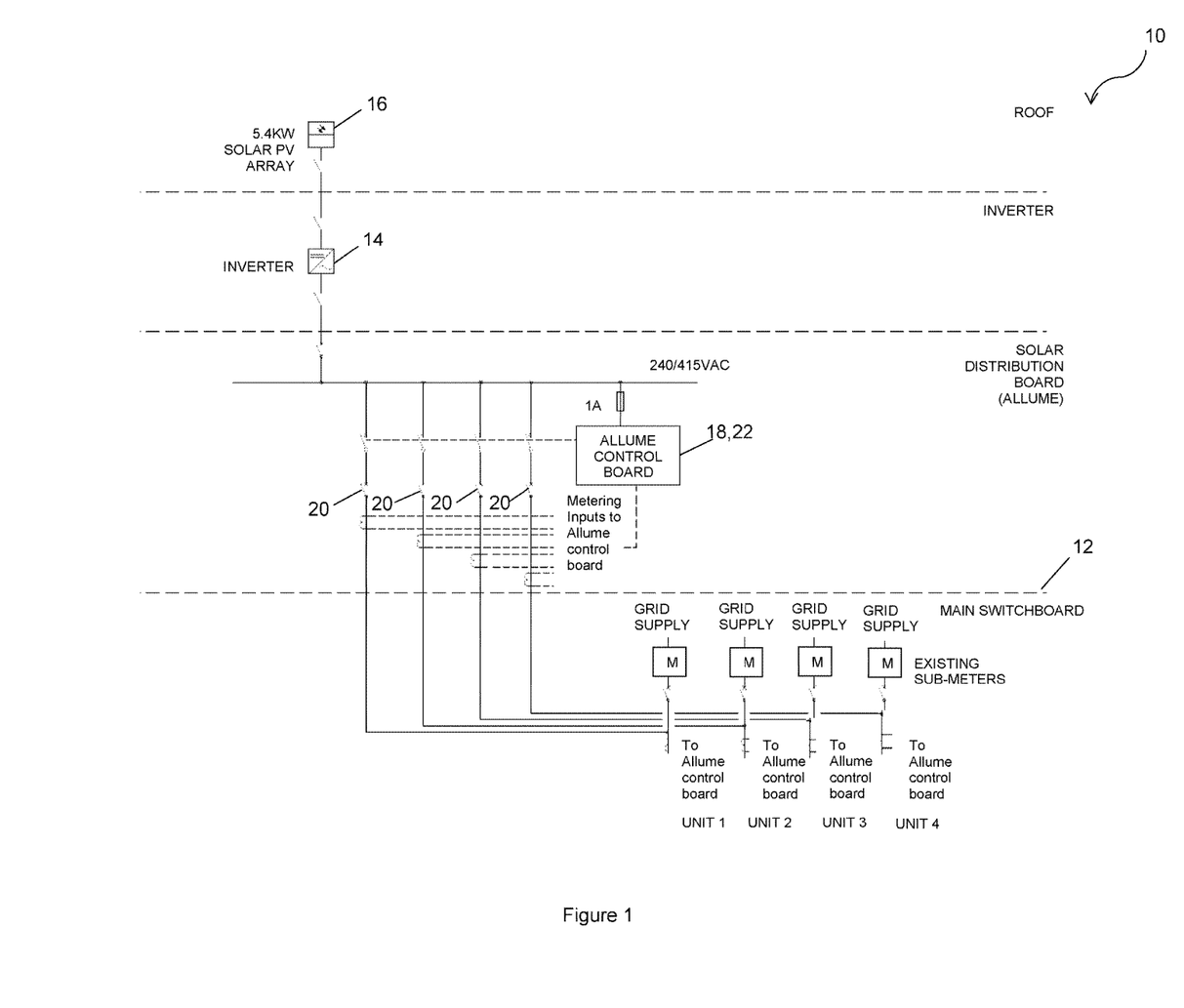
FIG. 1 is an example circuit diagram of a behind-the-meter system for controlled distribution of solar power according to an example embodiment of the present invention.
Figure 2:
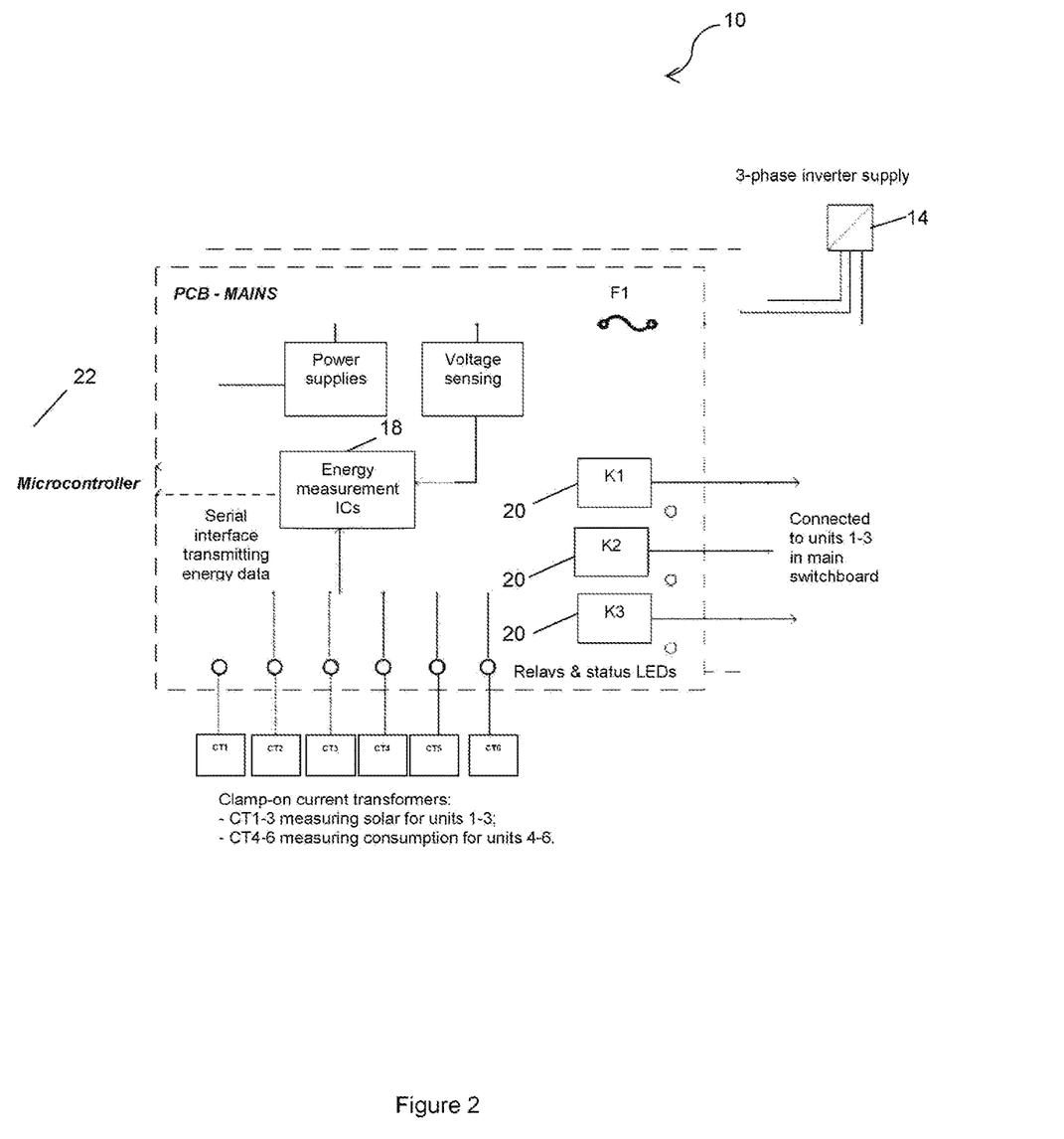
FIG. 2 is a schematic block diagram of the system.

FIGS. 1 and 2 illustrate an example embodiment of a behind-the-meter system 10 for controlled distribution of solar power to units 1-N in a multi-unit building (not shown) connected to an electric power grid 12. The system 10 may comprise a grid-tied inverter 14 connectable between a solar power generator 16 and the electric power grid 12. The solar power generator 16 may, for example, comprise a solar photovoltaic array. Each unit 1-N may comprise a circuit that is directly connected to the electric power grid 12, and may be metered by its own retail electricity meter, for example, an apartment, retail store, office, etc.

The system 10 may comprise sensors 18 configured to measure instantaneously power demand (ie, total power demand per unit 1-N) and solar power consumption (ie, solar power delivered to each unit 1-N) of the units 1-N, and solar power generation by the solar power generator 16. The sensors 18 may, for example, comprise power measurement ICs connected to power supply lines of the units 1-N by CT clamps. Alternatively, shunt resistors or Rogowski coils may be used instead of CTs for current sensing.

The use of non-intrusive CT clamps requires CTs to be installed at the distribution board, as well as the main switchboard and be wired back into the solar power distribution control board of the system 10. As described in further detail below, detached modules may be used to communicate data from the CTs to the control board via a serial cable or wireless communication protocol, meaning the physical wiring of individual CTs from the main switchboard to the distribution board is not required.

The system 10 may further comprise switches 20 configured to selectively connect and disconnect the units 1-N from the solar power generator 16. The switches may, for example, comprise SSRs.

At least one controller 22 may be connected to the sensors 18 and the switches 20. The at least one controller 22, SSRs and power management ICs may be provided on one or more PCBs. The at least one controller 22 may be configured to determine relative or proportional values of power demand and solar power consumption of the units based on the instantaneous measurements of the power demand and the solar power consumption of the units 1-N.

The at least one controller 22 may be further configured with a solar power distribution algorithm to selectively and individually control the switches 20 to dynamically distribute solar power from the solar power generator between the units 1-N based on the relative values of the power demand and the solar power consumption of the units 1-N to thereby maximise solar power consumption by the units 1-N. In other words, the solar power distribution algorithm may be used to configure the at least one controller 22 to control distribution of solar power by switching the switches 20 on or off to controllably distribute solar power between units 1-N. This may minimise export of solar power to the electric power grid 12 and thereby maximise efficiency of solar energy consumption by the units 1-N, where efficiency of solar energy consumption may be defined as:

$$\text{Efficiency} = 1 - \frac{\text{actual export} - \text{theoretical minimum export}}{\text{solar generation}}$$

In other words, the greater the efficiency, the higher proportion of solar power that is consumed within the multi-unit building, instead of being exported to the electric power grid 12.

Figure 3:
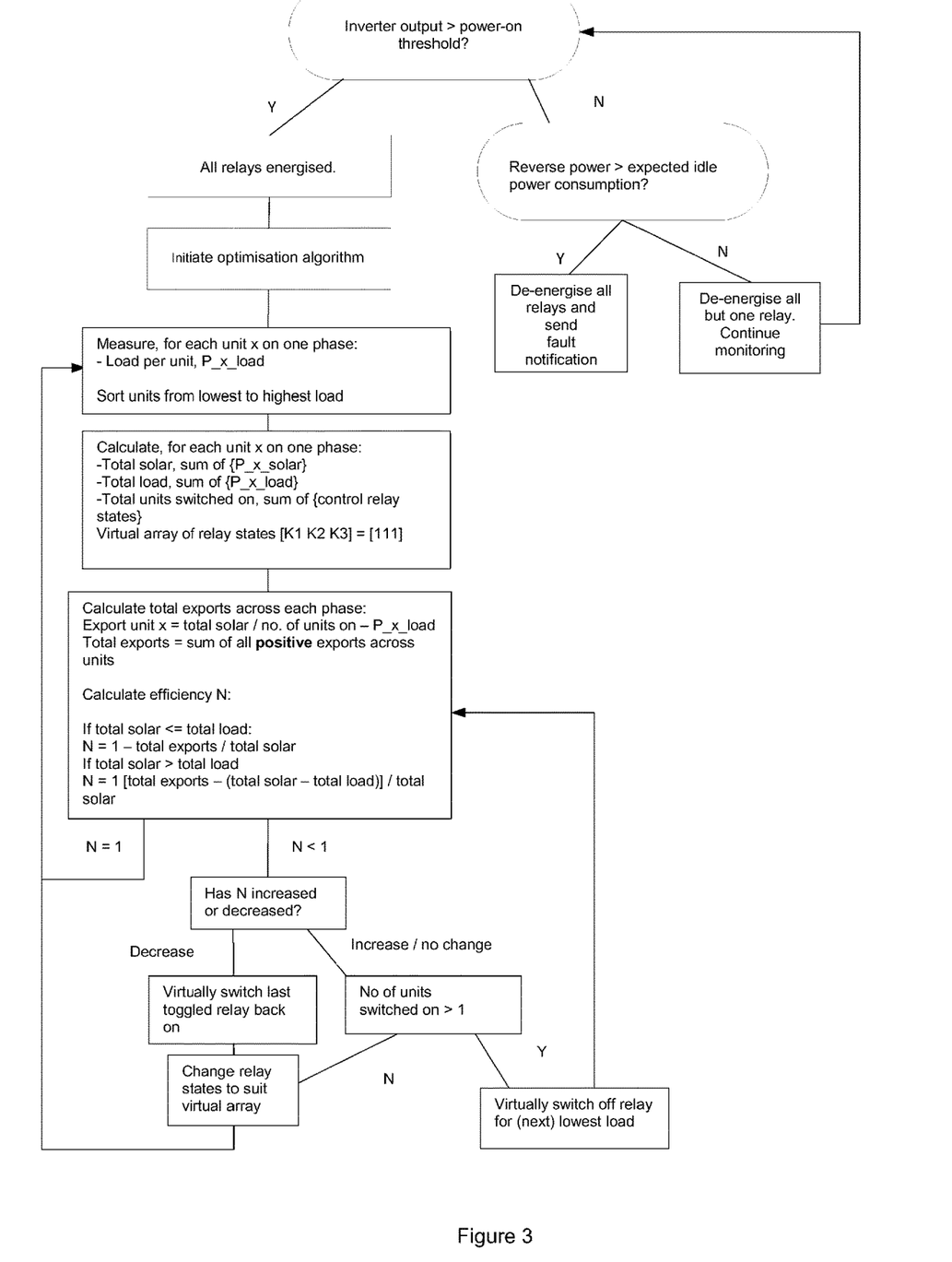
FIG. 3 is an example solar power distribution algorithm used by the system.

An example solar power distribution algorithm used by the at least one controller 22 is illustrated in FIG. 3 where "total solar" corresponds to measured solar power consumption, and "total load" corresponds to measured power demands, of the units 1-N.

Other examples of the solar power distribution algorithm may take account of other factors or parameters to dynamically distribute solar power from the solar power generator 16 to the units 1-N. For example, the solar power distribution algorithm may use instantaneous measurements of solar power generation by the solar power generator and solar power consumption by the units 1-N to optimise switching states for an intended business outcome. This outcome may be to maximise efficiency of solar consumption within the multi-unit building.

In some examples, the solar power distribution algorithm may, for example, assume even distribution across the units 1-N. This may represent a simplification of the dynamic, organic power distribution behaviour to minimise the complexity of the algorithm. Other examples of the solar power distribution algorithm may therefore more closely model the dynamic, organic distribution of solar power, and to improve accuracy and speed. This may include, for example, peak detection, machine learning and numerical optimisation techniques. For example, in some examples the solar power distribution algorithm may compare relative or proportional measured power demand between the units, and measured power demand per unit to total solar power generation. This may controllably distribute solar power to units 1-N that will consume most of the solar power.

Figure 4:
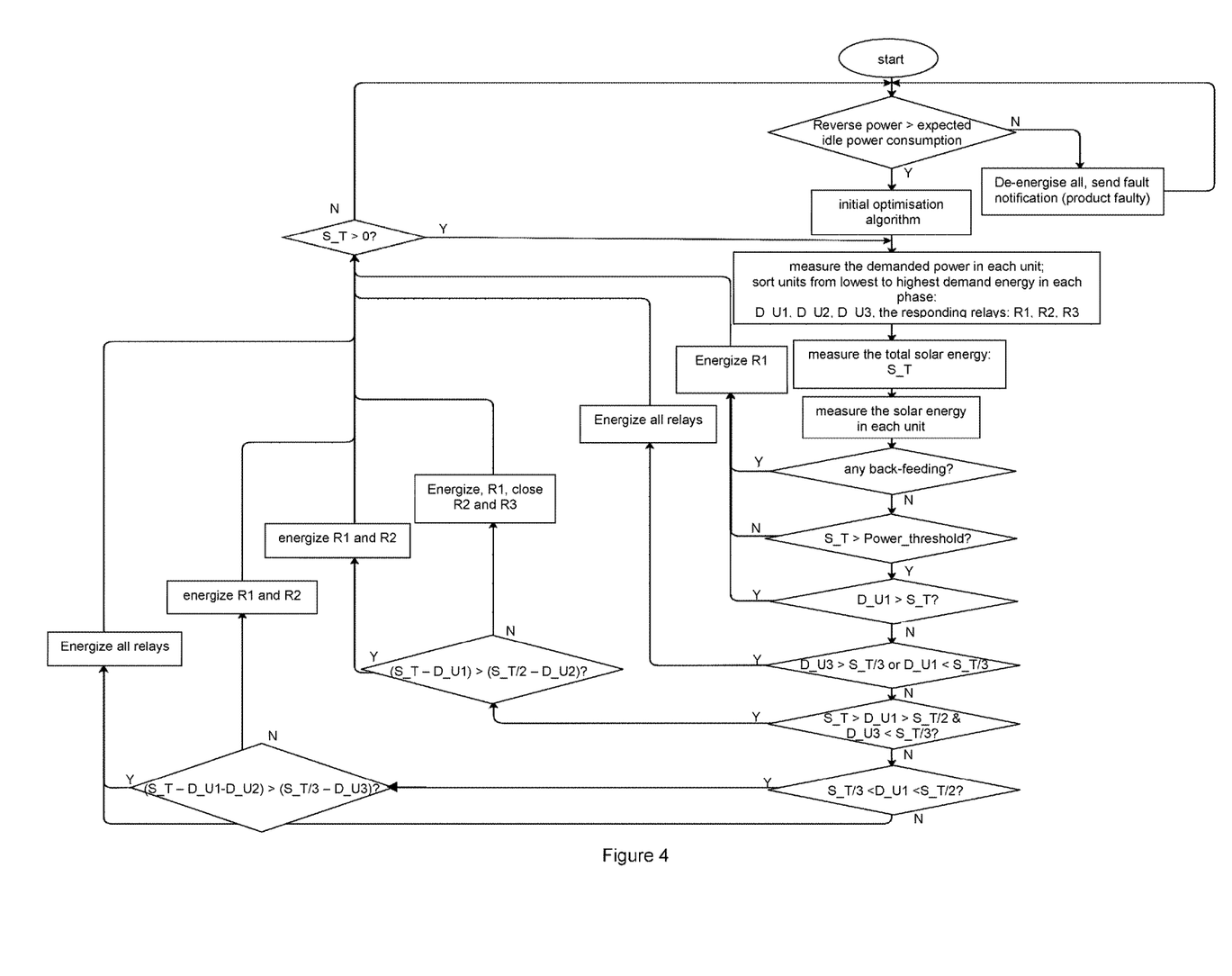
FIG. 4 is an example cross flow prevention algorithm used by the system.

The at least one controller 22 may be further configured with a cross flow prevention algorithm to dynamically prevent cross flow of solar power between the units 1-N. The cross flow prevention algorithm may pre-emptively identify cross flow of solar power based on the relative values of the power demand and the solar power consumption of the units, and the instantaneous measurements of the solar power generation by the solar power generator. Based on the pre-emptive identification of cross flow by the cross flow prevention algorithm, the at least one controller 22 may be further configured to selectively and individually control the switches 20 to isolate some or all of the units from the solar power generator 16 to thereby prevent the cross flow of solar power between the units 1-N. This may provide fail-safe protection functionality which prevents any cross flow of power between units 1-N when no solar power is being generated. All but one of the units 1-N may be isolated, so that the single unit 1-N that is not isolated may maintain contact between the grid-tied inverter 14 and the electric power grid 12, thereby avoiding shutdown of the grid-tied inverter 14 due to anti-islanding.

An example cross flow prevention algorithm is illustrated in FIG. 4. As illustrated, in this example the cross flow prevention algorithm may rank units 1-N based on their power demand, and may prioritise distribution of solar power to the units 1-N in order of demand. The cross flow prevention algorithm may selectively and individually isolate units 1-N with little to no demand from solar when there are large discrepancies in power demand between units 1-N. This is based on the assumption that cross flow occurs as power flows from units with little or no demand into units with high demand. This may be the premise for the cross flow prevention algorithm. The result being that the cross flow prevention algorithm may aim to switch on the minimum number of units 1-N required, in order of demand, to consume the solar power available from the solar power generator. The flowchart in FIG. 4 is shown for 3 units, but may be expanded to up to 10 units. The cross flow prevention algorithm may, example, pre-emptively identify potential cross flow of solar power between the units 1-N when one of the units 1-N is consuming a lot of solar power, and one or more of the other units 1-N is consuming little or no solar power. In this case, the at least one controller 22 may be configured to turn off the respective switch 20 of the unit 1-N that is consuming little or no solar power.

In other words, the cross flow prevention algorithm may configure the at least one controller 22 to have an override configuration to pre-empt any reverse flow of power from the electric power grid 12 through the meter of one unit 1-N, through the distribution system 10 and into another unit 1-N (ie, cross flow). If the sensors 18 detect a potential for this to occur, the at least one controller 22 may interrupt the solar power distribution algorithm to disconnect that unit 1-N from the solar power generator 16.

An advantageous feature of the grid-tied inverter 14 is its anti-islanding function. This acts by shutting down the inverter 14 when the inverter 14 cannot sense the grid 12. The intention of this is to prevent the inverter 14 from delivering solar power to the grid 12 in the case of a power outage. Without this function, utility workers may unknowingly be exposed to live voltages while performing maintenance on the grid 12. The system 10 ensures that the inverter 14 remains online while preventing cross-flow of power between units 1-N through the protection measures described above.

In addition, the cross flow prevention algorithm may configure the at least one controller 22 to isolate all units 1-N from the solar power generator when reverse power flow from the units 1-N back to the solar power distribution panel is detected, and this power exceeds the expected power consumption of the system 10. This may shut down the inverter 14 and trigger notification of a potential fault event.

Figure 5:
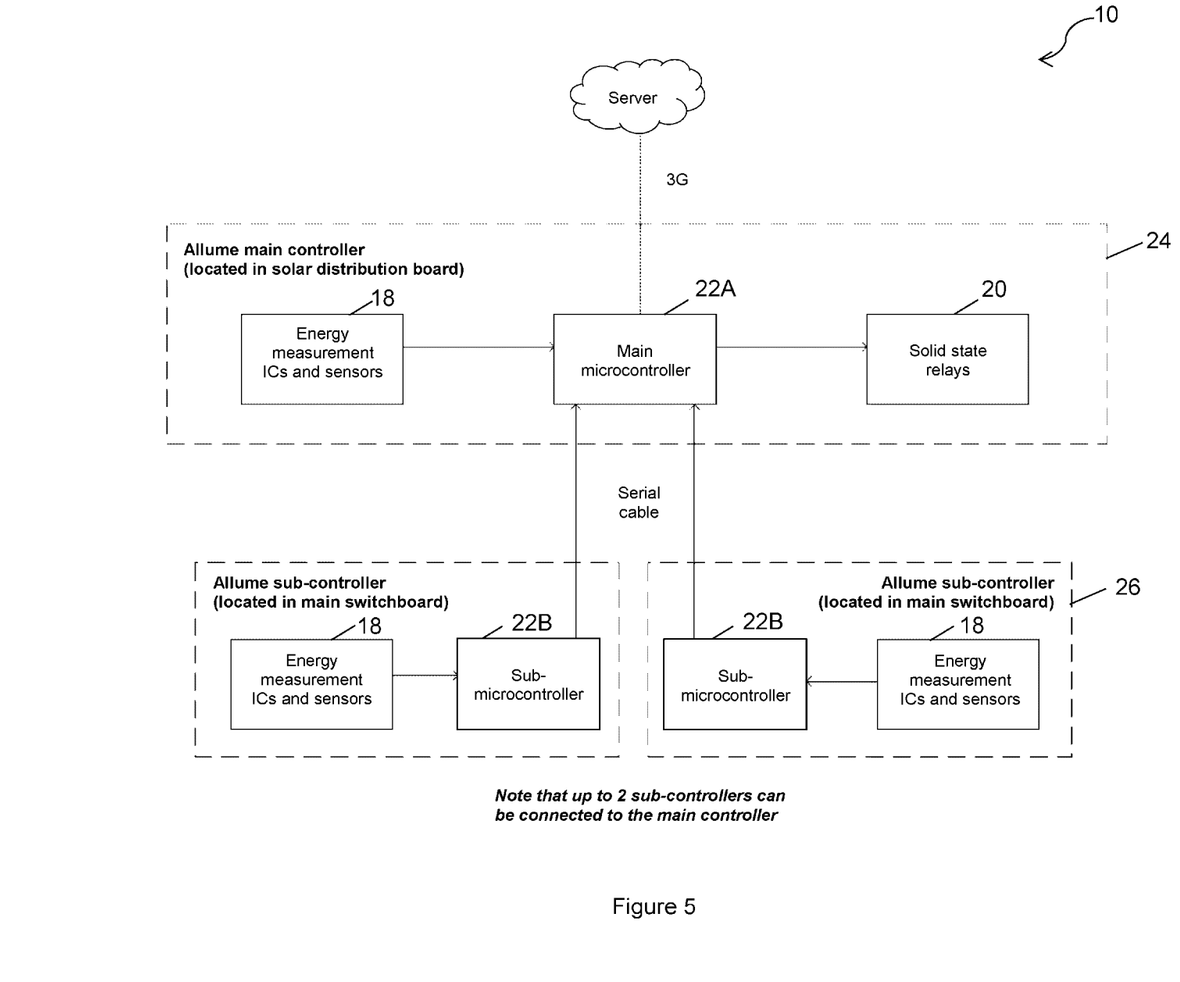
FIG. 5 is a schematic block diagram depicting the operation of the system with detached metering modules located in a main switchboard.
Figure 6:
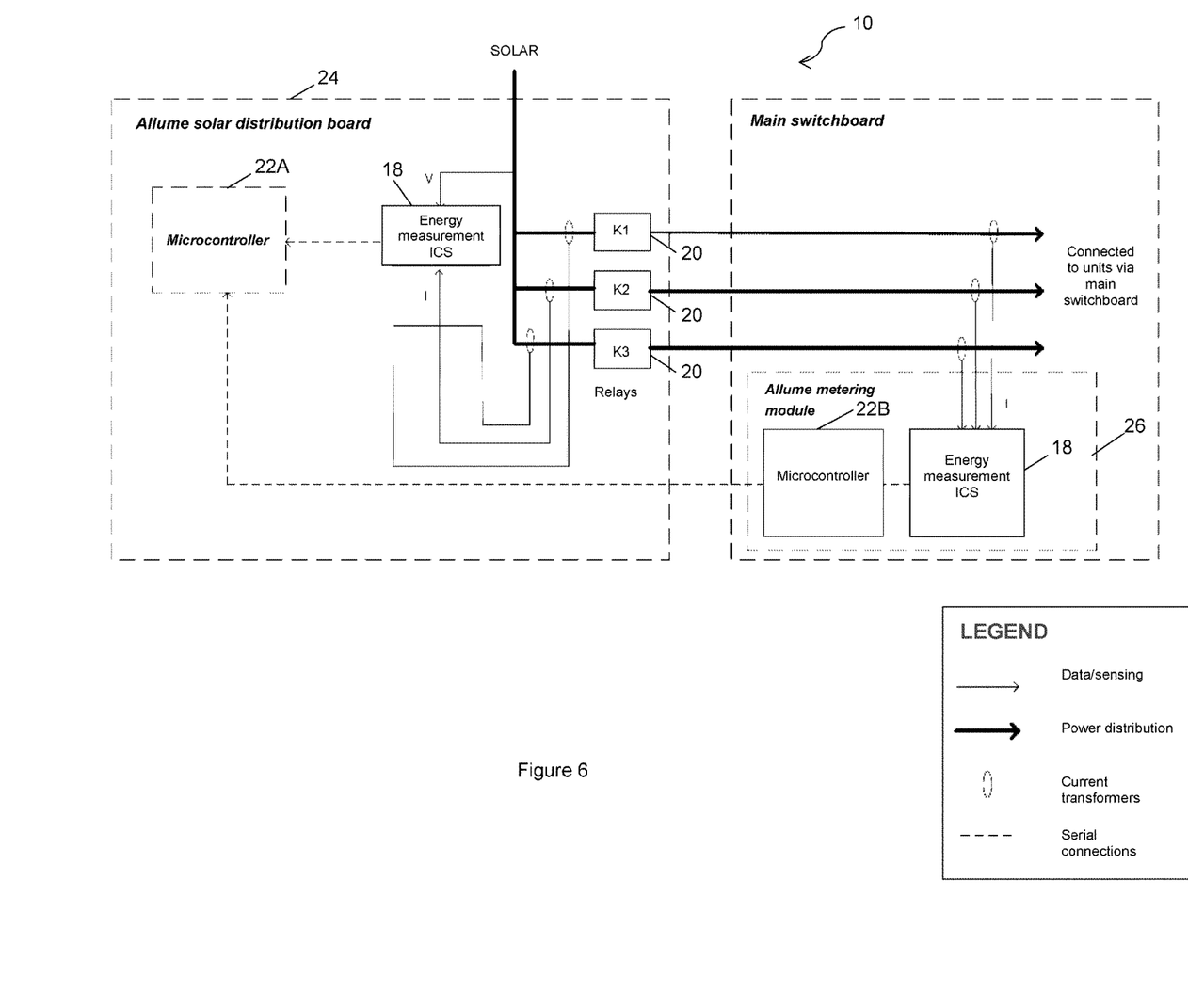
FIG. 6 is a schematic block diagram of the system with the detached metering module located in the main switchboard.

Referring to FIGS. 5 and 6, in example installations the components of the system 10 may be distributed into a main distribution control module 24 and detached metering modules 26. In this example, the at least one controller 22 may comprise a main microcontroller 22A and sub-microcontrollers 22B. The main microcontroller 22A may be connected to power management ICs and sensors 18 and SSRs 20 on one or more PCBs in the main distribution control module 24. The sub-microcontrollers 22B may be connected to power management ICs and sensors 18 on PCBs in the detached metering module PCBs 26.

The detached metering modules 26 may be wired and/or wirelessly connected to the main distribution control module 24. For example, the sensors 18 may have wireless capability, meaning physical wiring of CTs to the PCBs is not be required. To increase installation flexibility, the wireless CTs may communicate to a local gateway or directly to the main microcontroller 22A. The sensors 18 corresponding to the total demand per unit 1-N may be located on one or more detached metering module PCBs 26 in the main switchboard as illustrated in FIG. 6. The detached metering module PCBs 26 may comprise a separate sub-microcontroller 22B to consolidate energy demand reading per unit 1-N to be transmitted to the main microcontroller 22A via a serial communication protocol, such as RS-485 serial communication protocol, long distance SPI (Serial Peripheral Interface), Ethernet, and/or a wireless communication protocol.

For example, as switching frequency of the switches 20 increases, the performance of the solar power distribution algorithm and/or the cross flow prevention algorithm may be improved. The use of fast switching techniques where the SSRs are able to switch at a frequency of up to 100 Hz may improve the speed of the system 10. In this example, switching may be carried out at the zero crossing of each cycle or half-cycle. This may allow for finer modulation of average solar power delivered to units 1-N over a specific time interval.

In preferred embodiments, the system 10 may further comprises billing meters configured to measure the solar power delivered to each tenant ($d_n$), and the total power consumed by all participating tenants (C). The meters preferably comprise class 1 meters with 1% accuracy, for example, the 6 channel auditor from WattWatchers. The amount of solar power consumed by each unit 1-N may then be computed from measurements obtained from the billing meters, so that each unit 1-N may be billed only for the solar power actually consumed (which may be less than the solar power delivered to the unit 1-N). Specifically, the solar power consumed by each tenant ($s_n$) may be calculated as:

$$s_n = \frac{d_n}{D} \times C, \text{ where } C < D, \text{ or}$$

$$s_n = d_n, \text{ where } C > D.$$

Figure 7:
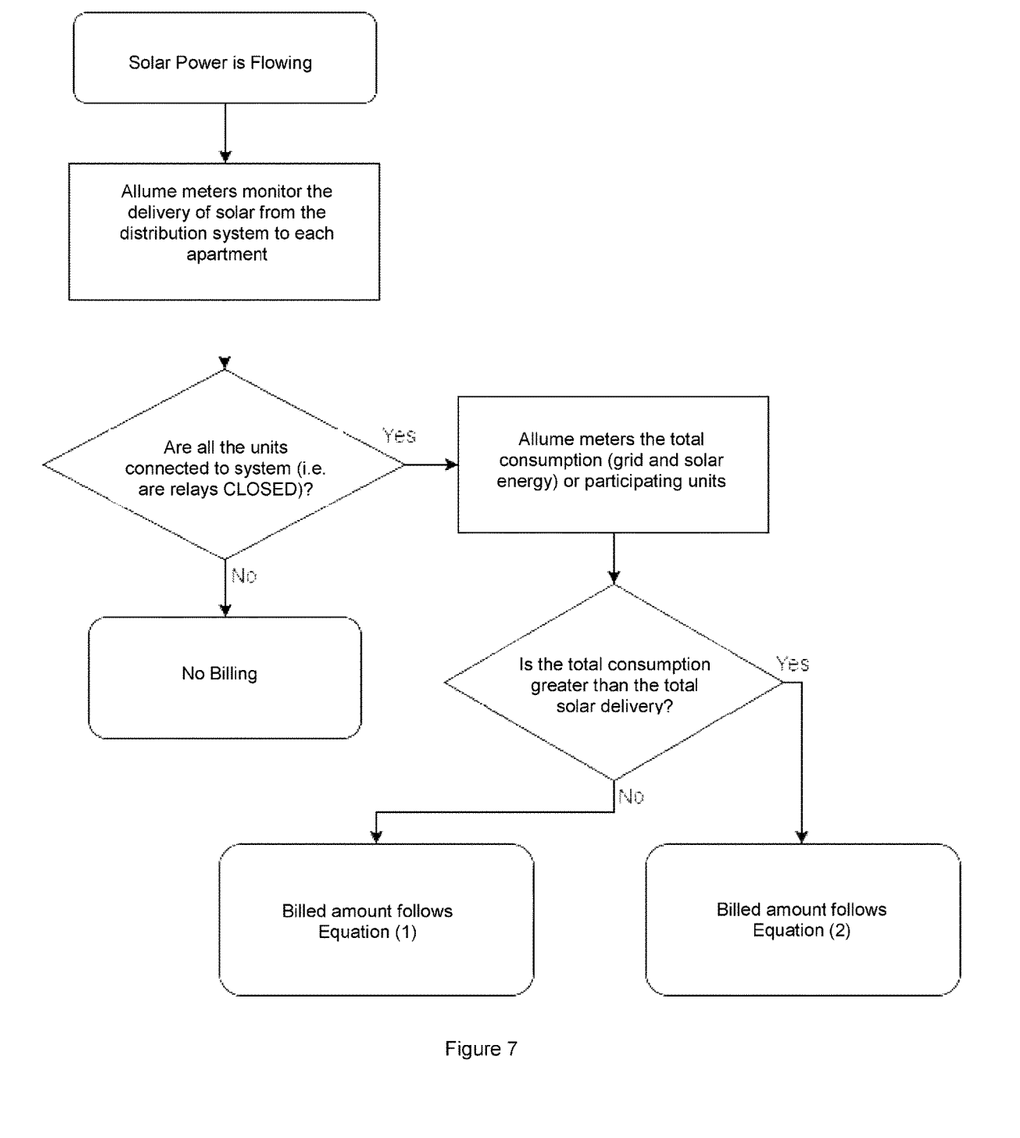
FIG. 7 is a flowchart of an example billing process for solar power supplied by the system.

FIG. 7 illustrates a preferred embodiment of the billing process according to the calculated solar power consumption ($s_n$). In preferred embodiments, the billing meters communicate the measurements and/or computed consumption to a monitoring and billing portal (not shown), via any suitable wired or wireless transmission method. Alternatively, the portal system may comprise a processor for computing consumption of each tenant ($s_n$) from the measurements received. The portal may be accessed via user devices (not shown) so that the tenants may view the performance of the shared solar asset, pay their bills, view financial and environmental savings resulting from the solar system, and combinations thereof. As shown in FIG. 7, if the switches 20 are inactivated, no solar power will be delivered to the units 1-N and the billing meters will detect this accordingly.

Embodiments of the system 10 may also provide demand management, for example, remote control of specific loads (eg, electric water heaters and other high-powered equipment) during times of excess solar generation. Control mechanisms may include wireless protocols or power line communications.

Embodiments of the system 10 may also provide a control algorithm to allow for "peak shaving" or the diversion of solar energy to a particular consumer in order to reduce peak demand for the billing period. This may be advantageous where commercial electricity contracts apply a high tariff to peak demand. For example, embodiments of the solar power distribution algorithm may include predictive algorithms and weather forecasting to control the switches 20.

Other embodiments of the system 10 may also provide a solar power export algorithm to maximise export to the grid through one or more selected units 1-N during times when the electric power grid 12 has limited generation capacity. This may be applied in specific contracts with electricity retailers, and may include external communications or an electronic data interface to the retailer's control systems.

The system 10 may be further provided with wireless communications capabilities and may be configured to allow for remote monitoring of control algorithm outputs, including but not limited to remote monitoring of switching states of the switches 20 and energy measurement data. This may allow integration of the two metering modules into a single metering module with 3G/4G capability (or equivalent communications protocol). Where remote monitoring is implemented, two-way communications may be added to enable an administrator of the system 10 to remotely connect and disconnect residents to solar as per contractual requirements.

The system 10 may be configured to interface with energy storage devices which are both AC and DC powered. This may allow for the system 10 to optimise the usage of the energy storage system, permitting a larger solar system to be installed without more export from the multi-unit building occurring. For example, the system 10 may be configured to be compatible with batteries. This may include AC-coupled and DC-coupled battery systems, as well as systems capable of supplying backup power in the event of grid failure. This may require interfacing with hybrid inverter systems.

To increase installation flexibility, the system 10 may be implemented using a split metering structure as described above. This may involve a separate metering module to be installed inside the main switchboard. This may monitor the individual consumption of each unit 1-N using CTs, wired to a metering module located in the main switchboard. This may then communicate to the main control board via a serial communication or via a wireless communication protocol. This implementation of the system 10 may be intended to avoid long CT cable runs between the main control module and the main switchboard.

Figure 8:
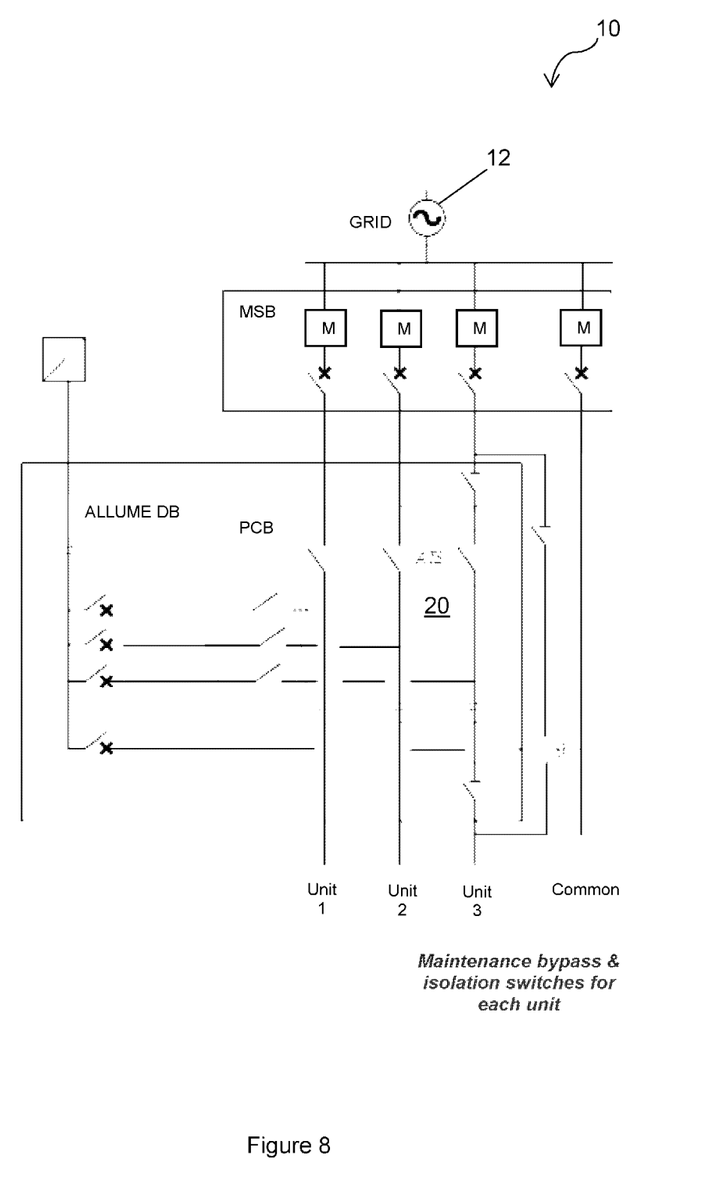
FIG. 8 is a circuit diagram of another embodiment of the system using automatic transfer switches (ATSs).

Referring to FIG. 8, other embodiments of the system 10 may use automatic transfer switches (ATS) on the PCBs to allow disconnection of the entirety, or parts of, the system 10 from the grid 12. This may facilitate zero export of solar energy to the grid 12, or emergency backup battery power solutions for the multi-unit building. This configuration may not require the solar power distribution algorithm described above as power would flow naturally to the units 1-N or loads that require it.

Embodiments of the present invention provide behind-the-meter systems that are both generally and specifically useful for dynamically distributing solar power to units in multi-unit building, and for dynamically preventing cross flow of solar power between the units.

For the purpose of this specification, the word "comprising" means "including but not limited to," and the word "comprises" has a corresponding meaning.

The above embodiments have been described by way of example only and modifications are possible within the scope of the claims that follow.

The invention claimed is:

1. A behind-the-meter system for controlled distribution of solar power to units in a multi-unit building connected to an electric power grid, wherein each unit is connected to the electric power grid, the system comprising:
   a grid-tied inverter connectable between a solar power generator and the electric power grid;
   sensors configured to measure instantaneously:
      power demand and solar power consumption of the units; and
      solar power generation by the solar power generator;
   switches having an ON and OFF configuration, the switches being configured to selectively connect and disconnect each unit from the solar power generator; and
   at least one controller connected to the sensors and the switches, wherein
      the at least one controller is configured to:
      dynamically determine relative values of power demand and solar power consumption of the units based on the instantaneous measurements of the power demand and the solar power consumption of the units; and
      selectively and individually control the switches to dynamically distribute solar power from the solar power generator to the units by switching the switches ON or OFF to controllably distribute solar power between the units by connecting or disconnecting each unit to the solar power generator based on the relative values of the power demand and the solar power consumption of the units to maximise solar power consumption by the units;
   wherein the at least one controller is further configured to:
      pre-emptively identify cross flow of solar power between the units based on;
      identifying the relative values of the power demand and the solar power consumption of the units; and
      the instantaneous measurements of the solar power generation by the solar power generator; and
         in response to that there are large discrepancies in power demand between units, selectively and individually controlling the switches to turn off the switch for at least one unit having little or no demand for solar power to isolate the at least one unit from the solar power generator, to prevent the cross flow of solar power between the units.

2. The system of claim 1, wherein the solar power generator comprises a solar photovoltaic array.

3. The system of claim 1, wherein the switches comprise solid-state relays (SSRs).

4. The system of claim 3, wherein the sensors comprise power measurement integrated circuits (ICs) connected to power supply lines of the units by current transformer (CT) clamps.

5. The system of claim 4, wherein the at least one controller, the SSRs and the power management ICs are provided on one or more printed circuit boards (PCBs).

6. The system of claim 5, wherein the at least one controller comprises a main microcontroller and sub-microcontrollers, and wherein the main microcontroller is connected to power management ICs and SSRs in a main distribution control module, and the sub-microcontrollers are connected to power management ICs in detached metering modules located in a main switchboard of the multi-unit building.

7. The system of claim 6, wherein the detached metering modules are wired and/or wirelessly connected to the main distribution control module.

8. A multi-unit building comprising the system of claim 1.

9. The system of claim 1, 2, or 3 wherein the at least one controller is configured to implement fast switching techniques.

10. The system of claim 9 wherein the switches are configured to switch at a frequency up to 100 Hz.

11. A behind-the-meter method for controlled distribution of solar power to units in a multi-unit building connected to an electric power grid, wherein each unit is connected to the electric power grid, the method comprising:
    connecting a grid-tied inverter between a solar power generator and the electric power grid;
    providing sensors configured to measure instantaneously:
        power demand and solar power consumption of the units; and
        solar power generation by the solar power generator;
    providing switches having an ON and OFF configuration, the switches being configured to selectively connect and disconnect each unit from the solar power generator;
    dynamically determining relative values of power demand and solar power consumption of the units based on the instantaneous measurements of the power demand and the solar power consumption of the units;
    selectively and individually controlling the switches to distribute solar power from the solar power generator to the units by switching the switches ON or OFF to controllably distribute solar power between the units by connecting or disconnecting each unit to the solar power generator based on the relative values of the power demand and the solar power consumption of the units to maximise solar power consumption by the units;
    pre-emptively identifying cross flow of solar power between the units based on;
    identifying the relative values of the power demand and the solar power consumption of the units; and
    the instantaneous measurements of the solar power generation by the solar power generator; and
        in response to that there are large discrepancies in power demand between units,
    selectively and individually controlling the switches to turn off the switch for at least one unit having little or no demand for solar power to isolate the at least one unit from the solar power generator, to prevent the cross flow of solar power between the units.

12. A multi-unit building using the method of claim 11.

* * * * *